US006469354B1

(12) United States Patent
Hirata

(10) Patent No.: US 6,469,354 B1
(45) Date of Patent: Oct. 22, 2002

(54) SEMICONDUCTOR DEVICE HAVING A PROTECTIVE CIRCUIT

(75) Inventor: Morihisa Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/275,037

(22) Filed: Mar. 24, 1999

(30) Foreign Application Priority Data

Mar. 24, 1998 (JP) ............................................. 10-075179

(51) Int. Cl.[7] .......................... H01L 23/62; H01L 29/76; H01L 27/097
(52) U.S. Cl. ....................... 257/358; 257/360; 257/363; 257/409; 257/484
(58) Field of Search ................................. 257/355, 356, 257/357, 358, 360, 361, 362, 363, 409, 452, 484, 490, 493, 494, 495, 605; 438/140, 454, 570, 48

(56) References Cited

U.S. PATENT DOCUMENTS 5,572,294 A  11/1996  Osawa et al. ................ 399/174
5,751,042 A  * 5/1998  Yu .............................. 257/360
5,754,380 A  5/1998  Ker et al. ....................... 361/56
5,874,763 A  2/1999  Ham ........................... 257/360

FOREIGN PATENT DOCUMENTS

| JP | 58-40865 | * 3/1983 |
| JP | 6-318674 | 11/1994 |
| JP | 8-288403 | 11/1996 |
| JP | 9-148452 | 6/1997 |
| JP | 9-181195 | 7/1997 |

* cited by examiner

Primary Examiner—Steven Loke
Assistant Examiner—Hung Kim Vu
(74) Attorney, Agent, or Firm—Foley & Lardner

(57) ABSTRACT

A semiconductor device includes a protective circuit at an input/output port thereof, wherein the protective circuit includes a plurality of protective MOS transistors. A diffused region is disposed between the n-type source/drain regions and a guard ring formed in a p-well for encircling the source/drain regions of the protective transistors. The diffused region is of lightly doped p-type or of an n-type and increases the resistance of a parasitic bipolar transistor formed in association with the protective transistors. The increase of the resistance assists protective function of the protective device against an ESD failure of the internal circuit of the semiconductor device.

5 Claims, 12 Drawing Sheets

TO INTERNAL CIRCUIT

16a TO PRE-BUFFER

SEMICONDUCTOR DEVICE HAVING A PROTECTIVE CIRCUIT

BACKGROUND OF THE INVENTION (a) Field of the Invention

The present invention relates to a semiconductor device having a protective circuit, and more particularly to a structure of a protective transistor capable of protecting the internal circuit of the semiconductor device against an electrostatic breakdown.

(b) Description of the Related Art

In general, when electrostatic charge enters a semiconductor device during the course of a fabrication or inspection process, or during a stage of mounting the semiconductor device onto electronic equipment, the internal circuit of the semiconductor device is prone to breaking. Therefore, a protective transistor is generally provided at an input/output port of a semiconductor device through which the internal circuit is connected to an external circuit.

FIGS. 1A and 1B show two of a plurality of input/output circuit sections of a typical semiconductor device. These input/output circuit sections are provided at peripheral portions of a chip of the semiconductor device so as to surround the internal circuit. Each of the input/output circuit sections is composed of paired nMOSFETs 31 and pMOSFETs 32. As shown in FIGS. 1A and 1B, by means of interconnects overlying the substrate, the input/output circuit section is fabricated selectively as a protective circuit or an output buffer. Alternatively, a portion of the input/output circuit section is fabricated as a protective circuit and the remaining portion is formed as an output buffer. The structure of such a transistor will be described with reference to the nMOSFET 31. In the present example, each nMOSFET 31 includes four protective transistors. The drain region 14n are connected to a pair of gate electrodes 15n in common. Similarly, the source regions 16n formed are connected to a pair of gate electrodes 15n in common. A via hole 13 provides connection between an overlying interconnect layer and an underlying drain region 14n or source region 16n. Each guard ring 18n is formed to surround the drain regions 14n and the source regions 16n and is connected to the ground line GND (in the case of nMOSFET 31). The guard ring 18n surrounding the transistors fixes the potential of the well or the substrate. In the case of nMOSFET 31, the drain regions 14n and the source regions 16n are implemented by an N+ diffused layer, the guard ring 18n is implemented by a P+ diffused layer, and the well 11n is of a P-conductivity type. By contrast, in the case of pMOSFET 32, the drain regions 14p and the source regions 16p are formed of a P+ diffused layer, the guard ring 18p is formed of an N+ diffused layer, and the well 11p is of an N-conductivity type. The guard ring 18p is connected to a power supply line VDD.

FIG. 1A is a top plan view of the input/output circuit section in the case of an input protective circuit, and FIG. 2A is an equivalent circuit diagram of the input/output circuit section of FIG. 1A. The drain regions 14n of the nMOSFET 31 and the drain regions 14p of the pMOSFET 32 are connected together, via an overlying interconnect 14a, to a pad 22 and an unillustrated input buffer of the internal circuit. The source regions 16n of the Cap nMOSFET 31 are connected, via the via holes 13, to the gate electrodes 15n as well as to the ground line GND. The source regions 16p of the pMOSFET 32 are connected, via the via holes 13, to the gate electrodes 15p as well as to the power supply line VDD. Through these connections, the input/output circuit section functions as an input protective circuit.

FIG. 1B is a top plan view of the input/output circuit section in the case of an output buffer, and FIG. 2B is an equivalent circuit diagram of the input/output circuit section of FIG. 1B. The drain regions 14n of the nMOSFET 31 and the drain regions 14p of the pMOSFET 32 are connected to another pad 22 via another interconnect 14a. The gate electrodes 15n and 15p are connected to an output of an unillustrated output pre-buffer of the internal circuit. When the output pre-buffer has a pair of complementary output lines, the gate electrodes 15n and 15p are connected to the output pre-buffer via a pair of signal lines. When the output pre-buffer has a single output, the gate electrodes 15n and 15p are connected to the output pre-buffer via a single signal line (not illustrated). The source regions 16n of the nMOSFET 31 are connected to the ground line GND via the via holes 13, and the source regions 16p of the pMOSFET 32 are connected to the power supply line VDD via the via holes 13. Through these connections, the input/output circuit section functions as an inverter and as a protective circuit.

FIG. 2C is an equivalent circuit diagram of an input/output circuit section, a part of which is formed as an input protective circuit, and the remaining portion of which is formed as an output buffer. In this case, among four transistors of each of the pMOSFET 32 and the nMOSFET 31, two transistors are used in order to form the input protective circuit, and the remaining transistors are used in order to form the output buffer. The connections for formation of the input protective circuit and the connections for formation of the output buffer are performed similarly to the case as described above. That is, the drain regions 14n of the nMOSFET 31 and the drain regions 14p of the pMOSFET 32 are connected together to the pad 22 via the interconnection layer 14a. The source regions 16n of the nMOSFET 31 constituting the input protective circuit are connected, via the via holes 13, to the gate electrodes 15n thereof as well as to the ground line GND. The source regions 16p of the pMOSFET 32 are connected, via the via holes 13, to the gate electrodes 15p thereof as well as to the power supply line VDD. The gate electrodes 15n and 15p of the transistors constituting the output buffer are connected to an unillustrated output pre-buffer of the internal circuit. The source regions 16n of the nMOSFET 31 are connected to the ground line GND via the via holes 13, and the source regions 16p of the pMOSFET 32 are connected to the power supply line VDD via the via holes 13. Through these connections, the input/output circuit section functions as an input protective circuit and as an output buffer.

Next, the operation of the input protective circuit formed by the input/output circuit section will be described with reference to FIGS. 3A and 3B. FIG. 3A is a cross section of the guard ring 18n of the nMOSFET 31 and a protective transistor adjacent thereto. FIG. 3B is a graph showing the input/output characteristics of the protective transistor. In FIG. 3A, since the drain 14n and the source 16n are formed of an N+ diffused layer, and a portion of the P-well 11 located beneath the gate 15n is of a P-conductivity type, an NPN parasitic transistor 12 is formed beneath the gate 15n. Specifically, the drain 14n corresponds to the collector 14c, the P-well 11 corresponds to the base 11c, and the source 16n corresponds to the emitter 16c of the parasitic transistor 12. The collector 14c is connected to the pad 22, and the emitter 16c is connected to the ground together with the guard ring 18n. A parasitic resistor 17 is formed between the base 11c and the guard ring 18n. In an ordinary state, since no voltage is applied to the base 11c, the parasitic transistor 12 is in an off state.

Next, the principle of the protective transistor will be described with reference to FIG. 3B. The abscissa represents the emitter-to-collector voltage (source-to-drain voltage), and the ordinate represents the collector current. Assuming that, due to electrostatic charge, positive surge voltage enters from the pad 22, a strong electric field is generated between the collector 14c and the emitter 16c, with the result that breakdown starts in the drain region 14n in the vicinity of the gate 15n (at BVDS ③ in FIG. 3B). Due to this breakdown, a small breakdown current flows from the pad 22 into the P-well 11 and then flows to the ground via the parasitic resistor 17 and the guard ring 18n through a path ① in FIG. 3A). When the small breakdown current flows through the parasitic resistor 17, a voltage is generated across the parasitic resistor 17 with a resultant increase in the potential of the base 11c. When the potential of the base 11c relative to the emitter 16c exceeds 0.6 to 0.7 volts (i.e., the threshold voltage VBE of the parasitic transistor), the parasitic transistor 12 turns on, resulting in that current starts to flow from the collector 14c to the emitter 16c through a path ② in FIG. 3A). The collector voltage at this stage will be referred to as an initial breakdown voltage V1 and the collector current at this stage will be referred to as a collector current I1 (point ④ in FIG. 3B). When the parasitic transistor 12 turns on, the emitter-to-collector voltage decreases abruptly to a snap-back voltage Vsnp that is determined at point ⑤ in FIG. 3B in accordance with the performance of the parasitic transistor 12.

When the current due to the ESD surge increases further, the current starts to flow to ground via the parasitic transistor 12 and the parasitic resistor 17 through paths ① and ② in FIG. 3A. However, due to the internal resistance of the parasitic transistor 12, the emitter-to-collector voltage increases with the collector current as shown as a snap-back region in FIG. 3B. When the emitter-to-collector voltage exceeds the withstand voltage of the parasitic transistor 12, the parasitic transistor 12 is destroyed at the state ⑥ shown in FIG. 3B. The emitter-to-collector voltage at the time of breakage of the parasitic transistor 12 is represented by Vmax, and the collector current at the time of breakage is represented by Imax in FIG. 3B.

Although the pMOSFET 32 operates similarly to the case of nMOSFET 31, the operation of the pMOSFET 32 differs from that of the nMOSFET 31 in that the pMOSFET 32 provides protection against negative surge voltage, because a PNP parasitic transistor is formed in the pMOSFET 32. In this way, even when an ESD surge on the order of tens of thousands volts is applied to the pad 22, the voltage of the drain 14n can-be suppressed to as low as a few tens of volts by the protective circuit including the nMOSFET 31 and the pMOSFET 32. Accordingly, an extreme high voltage due to ESD surge is not transmitted to the internal circuit, thereby preventing break down of the internal circuit.

In the protective circuit, the initial breakdown voltage V1 varies depending on the resistance of the parasitic resistor 17. In order to protect the internal circuit, the voltage V1 is preferably decreased to a possible extent. However, if the parasitic transistor 12 operates in response to ordinary signals, the internal circuit will fail to function. Therefore, the initial breakdown voltage V1 must be greater than several times the voltage of ordinary signals. In order to secure a desired initial breakdown voltage V1, the resistance of the parasitic resistor 17 of the P-well 11 must be set to a specific value. The impurity concentration of the P-well 11 is determined in accordance with the performance of transistors that constitute the internal circuit and other factors, and therefore, the resistance of the parasitic resistor 17 can be determined through change of the impurity concentration of the P-well 11. If the impurity concentration of the P-well 11 is to change, separate processes for forming different wells must be provided for the internal circuit and the input/output circuit section in order to change the impurity concentration of the P-well 11. This increases the number of processes, with a resultant increase in the cost of the semiconductor device. Therefore, this method is not preferred.

In order to set the resistance of the parasitic resistor 17 at the specific value, the distance 20 between the source 14n and the guard ring 18n may be set to a desired value. Incidentally, in response to demands for reduction in cost and increase in operational speed of semiconductor devices, transistor elements that constitute an internal circuit have been progressively miniaturized year after year. In order to reduce the size of a semiconductor device, the impurity concentration of the substrate must be increased in accordance with the scaling-down rule. Since the resistivity of the substrate decreases as the impurity concentration increases, the distance between the guard ring and the source should be increased for a larger resistance. In an exemplified case where the impurity concentration of the substrate is $2.0 \times 10^{17}$ $cm^{-3}$, the distance between the guard ring and the source should be set at 10 $\mu$m. However, this relatively large distance increases the area occupied by the protective transistor, hindering efforts to increase the degree of integration.

SUMMARY OF THE INVENTION

In view of the foregoing, an object of the present invention is to provide a structure of a protective transistor suitable for miniaturized semiconductor devices.

The present invention provides, in an embodiment thereof, a semiconductor device including a semiconductor substrate having a substrate region of a first conductivity type or a second conductivity type opposite to the first conductivity type, a well region of the first conductivity type formed on a surface region of the semiconductor substrate and having a first impurity concentration, a guard ring of the first conductivity type disposed on a surface region of the semiconductor substrate within the well region, a MOS transistor having source/drain regions of the second conductivity type and surrounded by the well region, and a diffused region disposed between the source/drain regions of the MOS transistor and the guard ring, the diffused region being of the first conductivity type having a second impurity concentration lower than the first concentration or of the second conductivity.

In accordance with the embodiment of the semiconductor device of the present invention as described above, since the substrate region of a first or second conductive type is provided between the source of a protective transistor and the guard ring, the parasitic resistance of the parasitic bipolar transistor can be increased, resulting in that the distance between the source and the guard ring need not be large, and thus, a small chip size for the semiconductor device can be obtained.

The above and other objects, features and advantages of the present invention will be more apparent from the following description, referring to the accompanying drawings.

BRIEF DESCRIPTION OF THE DRAWINGS

FIGS. 1A and 1B are top plan views of a conventional semiconductor device, wherein FIG. 1A shows an input/output circuit section fabricated as an input protective circuit, and FIG. 1B shows an input/output circuit section fabricated as an output buffer;

FIGS. 2A–2C are circuit diagrams of input/output circuit sections, in which FIGS. 2A and 2B are the circuit diagrams of the input/output circuit sections of FIGS. 1A and 1B, and FIG. 2C is a circuit diagram of an input/output circuit section, a part of which is fabricated as an output buffer;

DESCRIPTION OF THE PREFERRED EMBODIMENTS

Generally, an input/output circuit section of the semiconductor device according to the present invention includes a pair of MOSFETs including an nMOSFET and a pMOSFET, as in the case of conventional input/output circuit section described in the Related Art section. By means of overlying interconnects formed above the substrate, the input/output circuit section is selectively fabricated as a protective circuit or an output buffer. Alternatively, a portion of the input/output circuit section is fabricated as a protective circuit and the remaining portion is formed as an output buffer. Since the interconnects used for the input/output circuit section in the semiconductor device of the present invention are similar to those in the conventional input/output circuit section, the description therefor is omitted. In addition, in the following description, among the transistors of the input/output circuit section, only the structure of the nMOSFET will be described in detail, because, with the exception of polarity, the pMOSFET has a structure similar to that of the nMOSFET.

First Embodiment

Figures 1A, 1B:
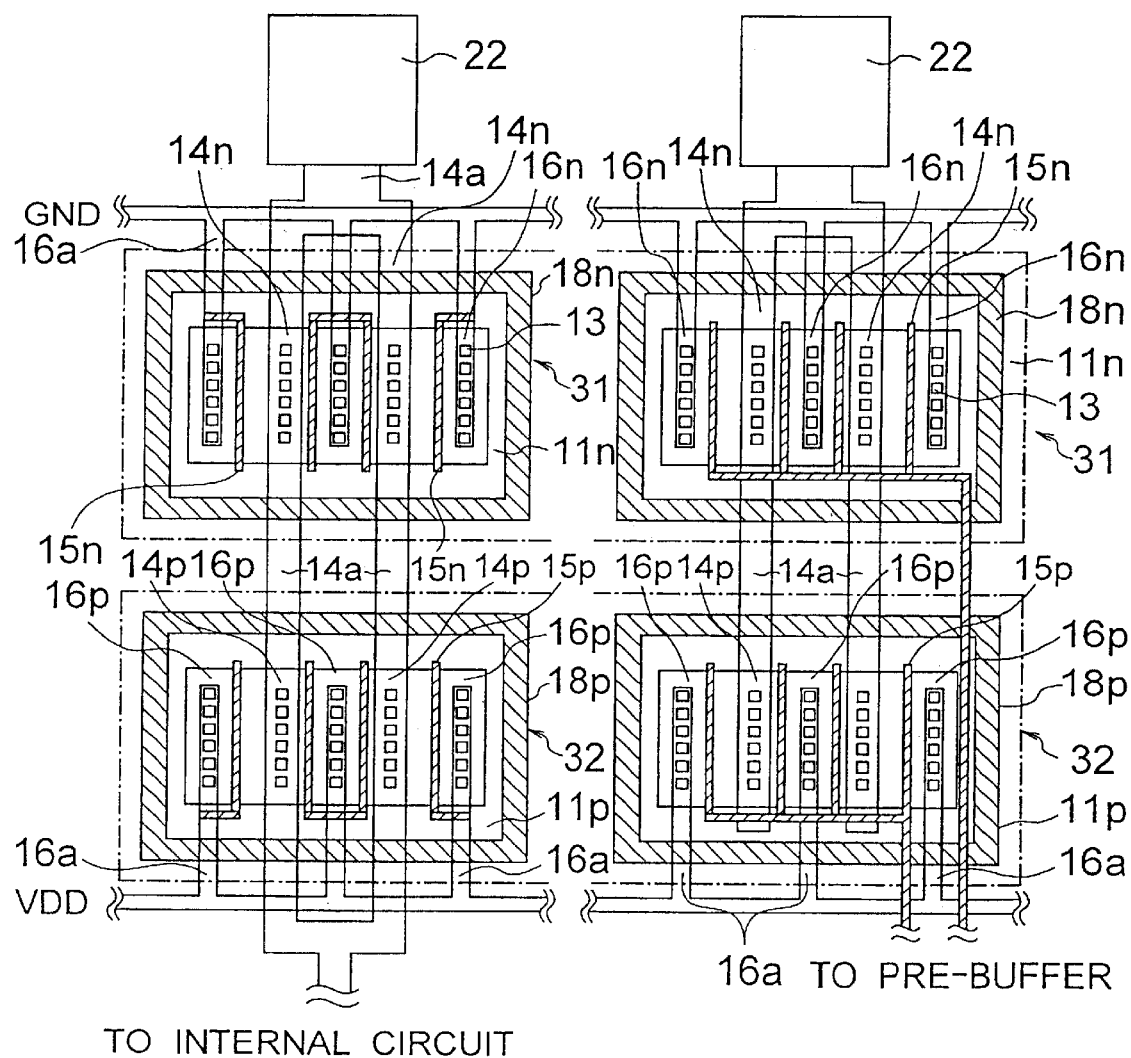
Figure 2A:
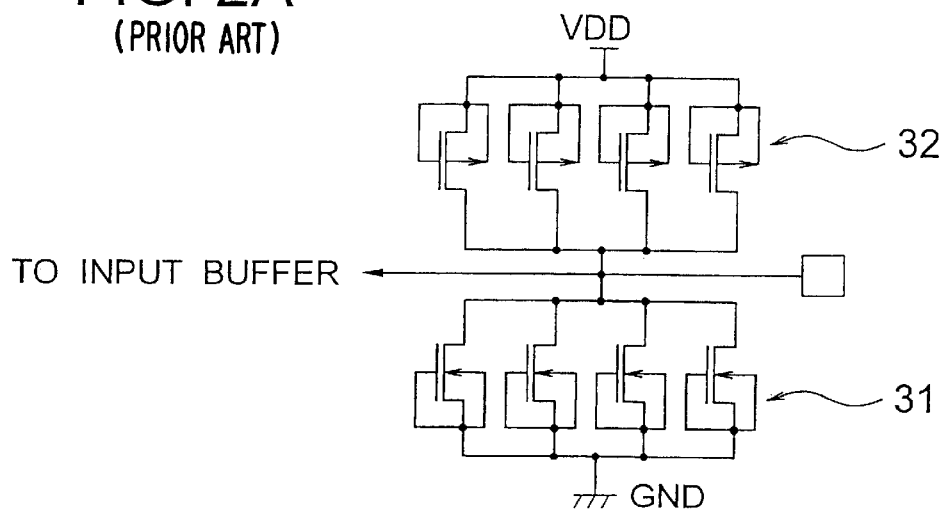
Figure 2B:
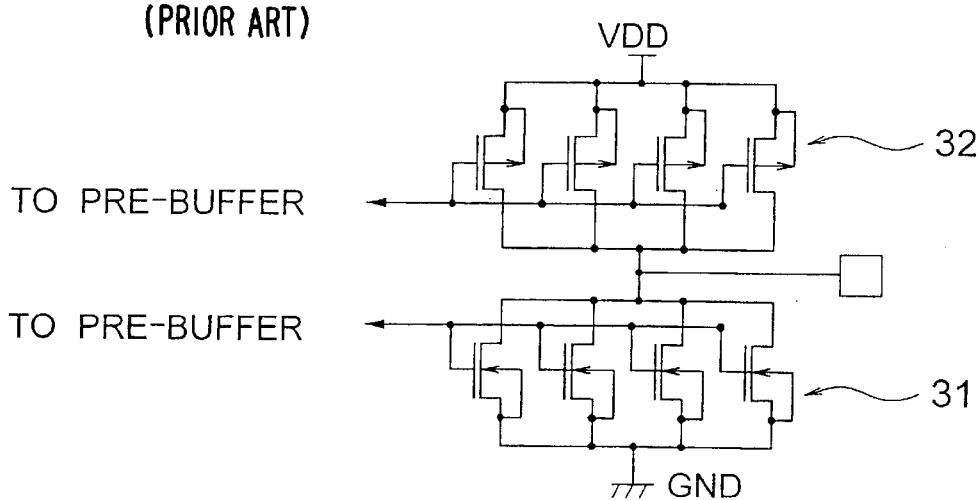
Figure 2C:
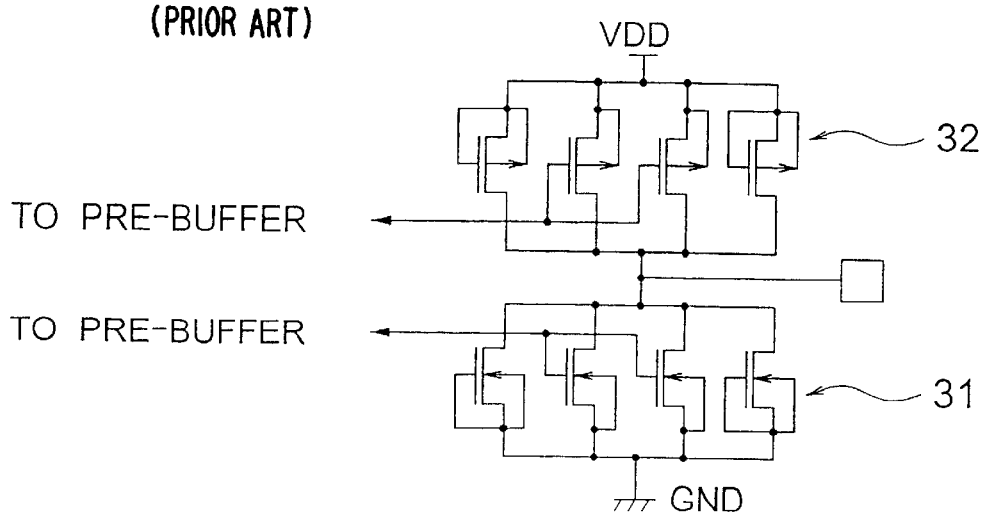
Figure 3A:
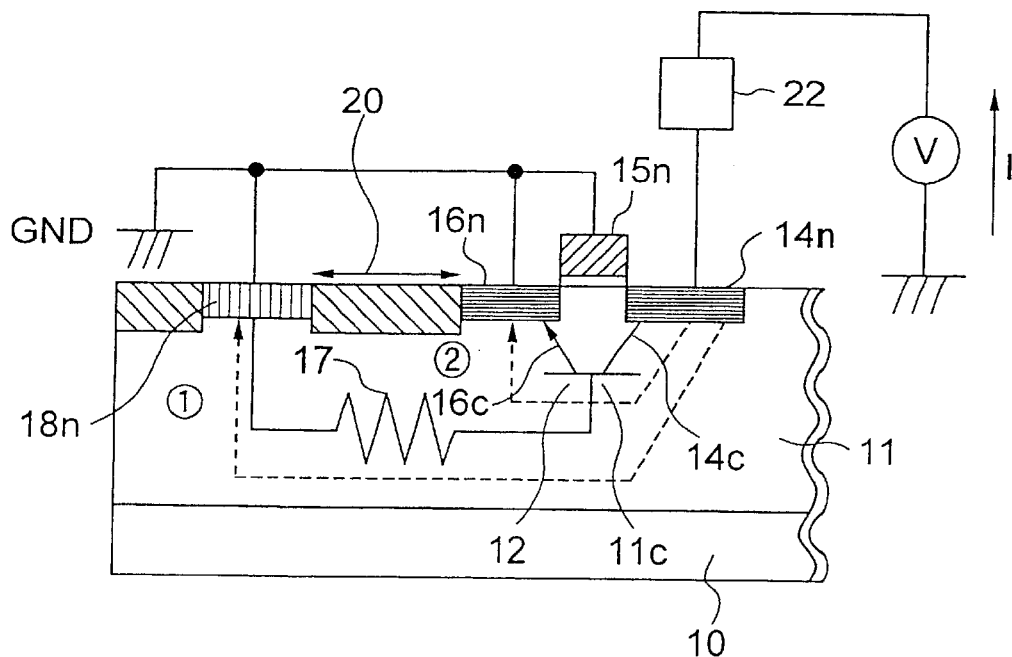
FIG. 3A is a sectional view of the conventional semiconductor device.
Figure 3B:
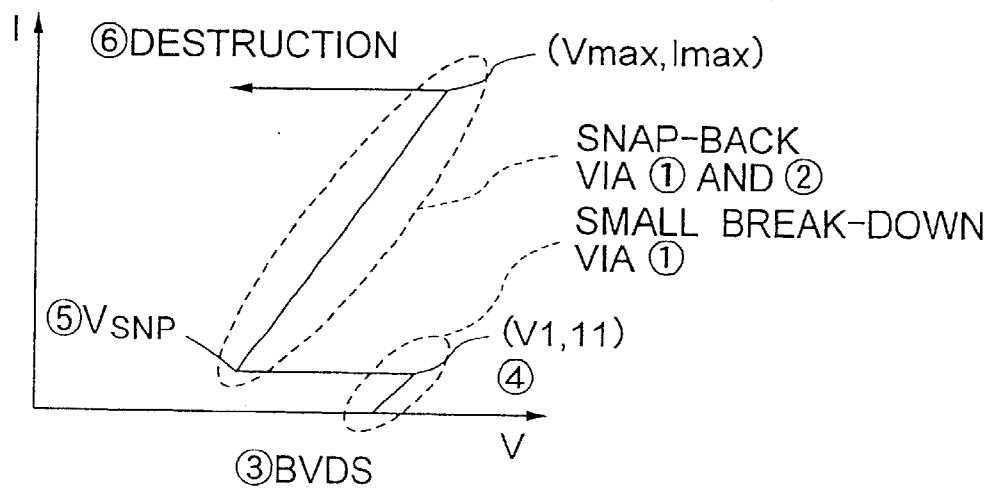
FIG. 3B is a graph showing the operation of the protective transistor in FIG. 3A.
Figure 4A:
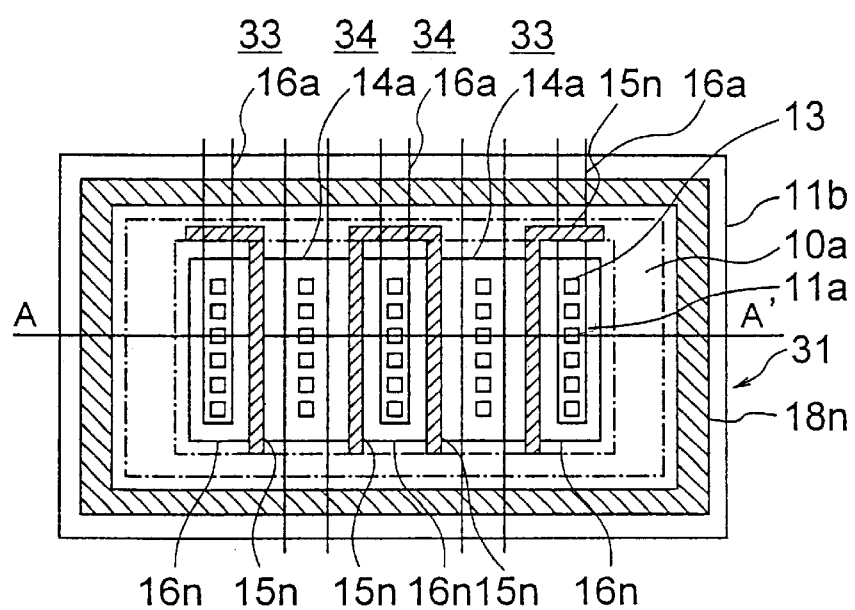
FIG. 4A is a top plan view of a semiconductor device according to a first embodiment of the present invention.
Figure 4B:
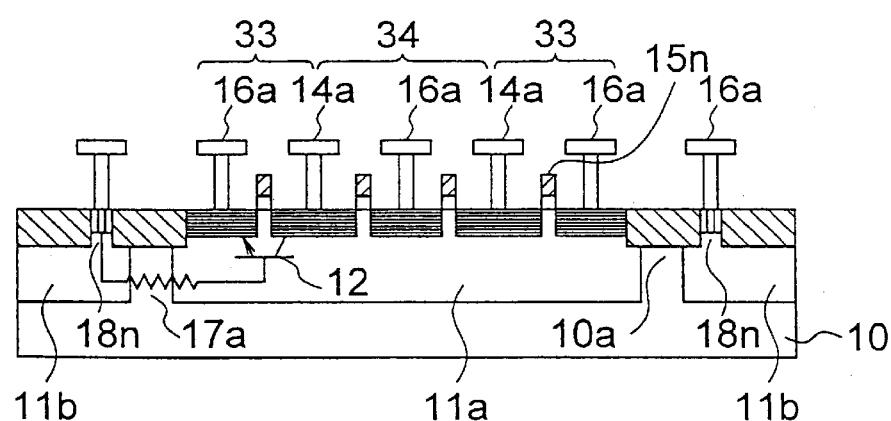
FIG. 4B is a sectional view taken along line A–A' in FIG. 4A.
Figure 4C:
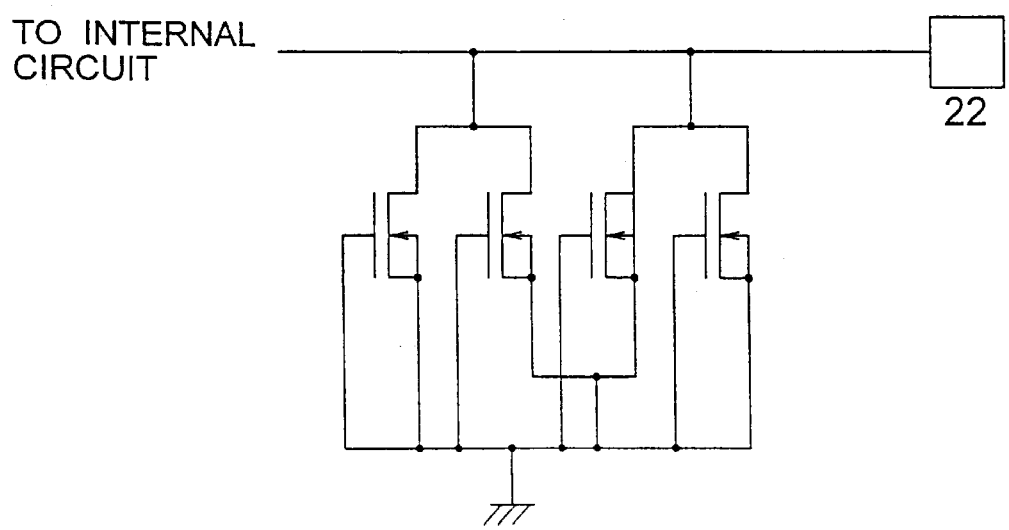
FIG. 4C is anequivalent circuit diagram thereof.

Referring to FIGS. 4A–4C showing schematic structures of the nMOSFET for the protective circuit in the present embodiment, a first P-well 11a is formed on a P-conductivity type (referred to as simply P-type, hereinafter) substrate 10, wherein four transistors 33 and 34 are formed. Further, an annular second P-well 11b is formed to surround the first P-well 11a with a predetermined distance therebetween. A guard ring 18n formed as a P+ diffused region is provided in the second P-well 11b such that the guard ring 18n surrounds the transistors 33 and 34. Adjacent to inner periphery of the guard ring 18n, a lightly-doped P-type region 10a having an impurity concentration lower than that of the P-well 11 is provided as underlying a field oxide film 19. Among the four transistors 33 and 34, transistors adjacent to the guard ring 18n will be referred to as first transistors 33, and transistors located between the first transistors 33 will be referred to as second transistors 34, in this text. The drains 14n of the first and second transistors 33 and 34 are connected to a pad 22 and an internal circuit via an interconnect 14a, and the sources 16n and the gates 15n of the first and second transistors 33 and 34 are connected to the ground via an interconnect 16a. In the present embodiment, each of the first and second P-wells 11a and 11b has a depth of 3 µm and L –0.4 µm. The lightly doped P-type region 10a is implemented by a surface region of the semiconductor substrate 10 and has an impurity concentration of $1 \times 10^{15}$ cm$^{-3}$.

Next, the operation will be described with reference to FIG. 4B. As in the case of conventional technique, an NPN parasitic transistor 12 is formed at a location corresponding to the first transistor 33 adjacent to the guard ring 18n such that the drain 14n serves as a collector, the source 16n serves as an emitter, and the first P-well 11a serves as a base. A parasitic resistor 17a is formed between the base and the guard ring 18n. When a surge voltage due to electrostatic charge is applied to the pad 22, a surge current flows to the drain via the interconnect 14a, resulting in breakdown occurring at the interface between the drain region 14n and the first P-well 11a. Due to the breakdown, surge current flows from the pad 22 to the guard ring 18n via the parasitic resistor 17a; i.e., via the first P-well 11a, the lightly-doped P-type region 10a, and the second P-well 11b, and then flows to the ground. When the surge current flows through the parasitic resistor 17a, a voltage drop is generated across the parasitic resistor 17a. When the base voltage of the parasitic transistor 12 exceeds the threshold voltage VBE, a current flows through the parasitic transistor 12, resulting in that the collector voltage is suppressed to a predetermined value or less. In this way, the protective circuit prevents the ESD surge from being transmitted to the internal circuit to thereby protect the internal circuit.

As described above, the parasitic resistor 17a in the present embodiment is formed in the first P-well 11a, the lightly-doped P-type region 10a, and the second P-well 11b.

Since the impurity concentration of the lightly-doped P-type region 10a is two orders of magnitude lower than that of the first and second P-wells 11a and 11b, the resistivity of the lightly-doped P-type region 10a is large. Therefore, even when the length of the parasitic resistor 17a is made smaller than that of the conventional parasitic resistor 17 implemented by the P-well 11, the resistance of the parasitic resistor 17a can be made equal to that of the conventional parasitic resistor 17. Conventionally, the distance between the guard ring 18n and the source region 16n of the first transistor 33 adjacent to the guard ring 18n is on the order of 10 μm. By contrast, a similar parasitic resistance can be obtained even when the distance is decreased to about 3 μm. Therefore, the size of the nMOSFET 31 can be decreased, so that the chip size of the semiconductor device can be decreased. Further, since the lightly-doped P-type region 10a between the first P-well 11a and the second P-well 11b can be formed through modification of a mask pattern for the wells in the internal circuit, the P-type region 10a can be formed without involving an additional fabrication process.

Second Embodiment

Figure 5A:
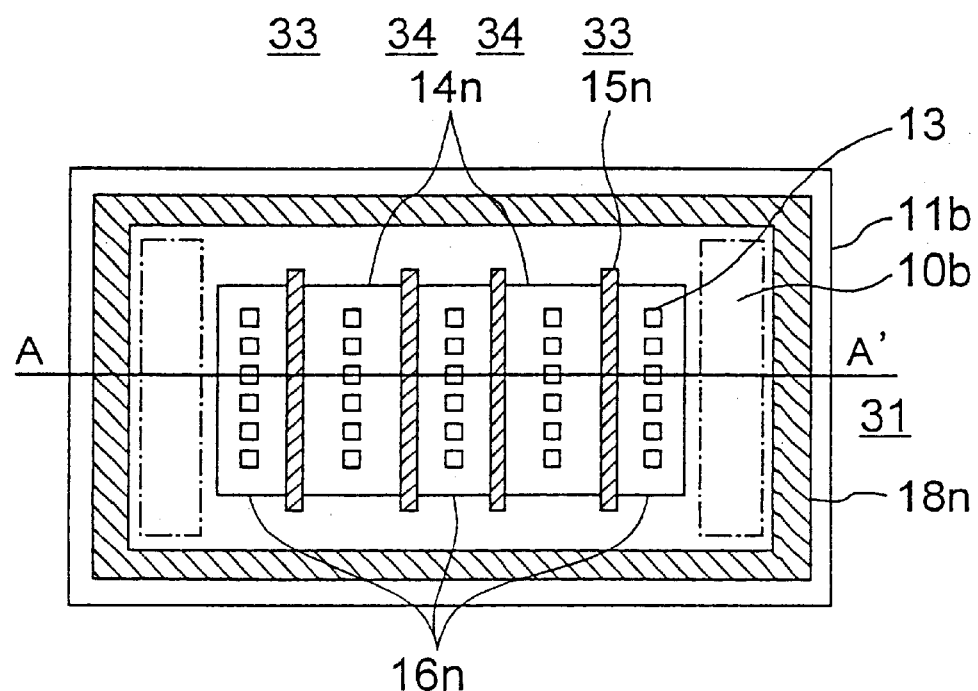
FIG. 5A is a top plan view of a semiconductor device according to a second embodiment of the present invention.
Figure 5B:
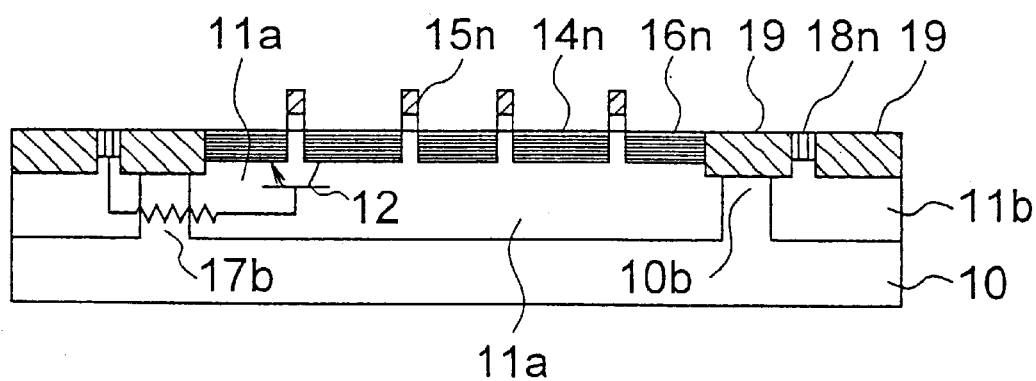
FIG. 5B is a sectional view taken along line A–A' in FIG. 5A.

Referring to FIGS. 5A and 5B, the semiconductor device according to the present embodiment is similar to the first embodiment except that a P-type substrate region 10b formed as a lightly-doped region of a P-type or first conductivity type is provided only between the guard ring 18n and the source 16n of a protective transistor adjacent to the guard ring 18n. Specifically, the P-type substrate region 10b is formed between each of the first transistors 33 and the corresponding side of the guard ring 18n extending parallel to the longitudinal direction of the gates 15 and is not formed between each of the first and second transistors 33 and 34 and the corresponding side of the guard ring 18n extending perpendicular to the longitudinal direction of the gates 15. As shown in FIG. 5B, each of the P-type substrate regions 10b between the first transistors 33 and the guard ring 18n is formed under a field oxide film 19. As in the first embodiment, a parasitic resistor 17b of the present embodiment is formed by the first P-well 11a, the lightly doped P-type region 10b, and the second P-well 11b. In recent semiconductor devices, the number of input/output terminals sometimes reaches a few hundred. Also, as described above, the input/output circuit sections are disposed at the peripheral portion of a chip that constitutes a semiconductor device. Therefore, a large number of input/output circuit sections cannot be disposed unless the dimension of each input/output circuit section in the direction parallel to a longer side of a chip (in the right/left direction in FIG. 5A) is made small. By contrast, in the direction perpendicular to the longer side of the chip, the distance between the transistors and the guard ring 18n can be maintained at a conventional value, because there is a sufficient room in the direction perpendicular to the longer side of the chip (in the vertical direction in FIG. 5A). Therefore, a resistance equal to that of the conventional parasitic resistor can be secured in the right/left direction in FIG. 5A through provision of the lightly doped P-type region 10b. Although the first and second P-wells 11a and 11b are connected together in the vertical direction in FIG. 5A, the distance between the guard ring 18n and the sources in the vertical direction can be made equal to the conventional distance, so that a resistance equal to that of the conventional parasitic resistor can be secured in the vertical direction. The width of the lightly-doped P-type region 10a is set to, for example, about 3 μm, and the distance between the guard ring and the sources in the vertical direction is set to, for example, about 10 μm. As a result, the breakdown voltage of the input protective circuit can be made equal to that of the conventional input protective circuit. Further, since the lightly-doped P-type region 10b between the first well 11a and the second P-well 11b can be formed through modification of a mask pattern for the well, the lightly-doped P-type region 10b can be formed without addition of any specific fabrication process.

Third Embodiment

Figure 6A:
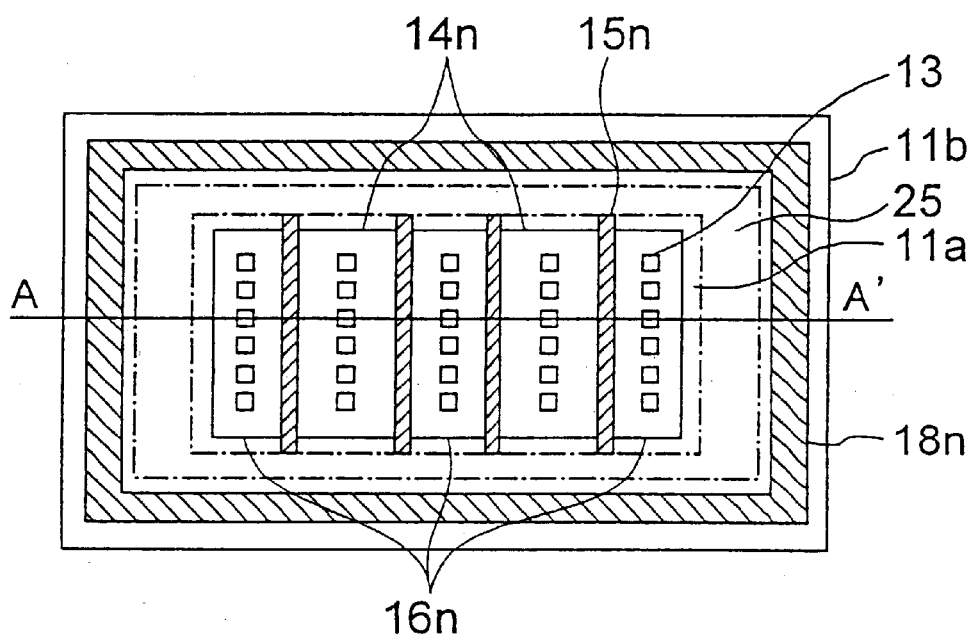
FIG. 6A is a top plan view of a semiconductor device according to a third embodiment of the present invention.
Figure 6B:
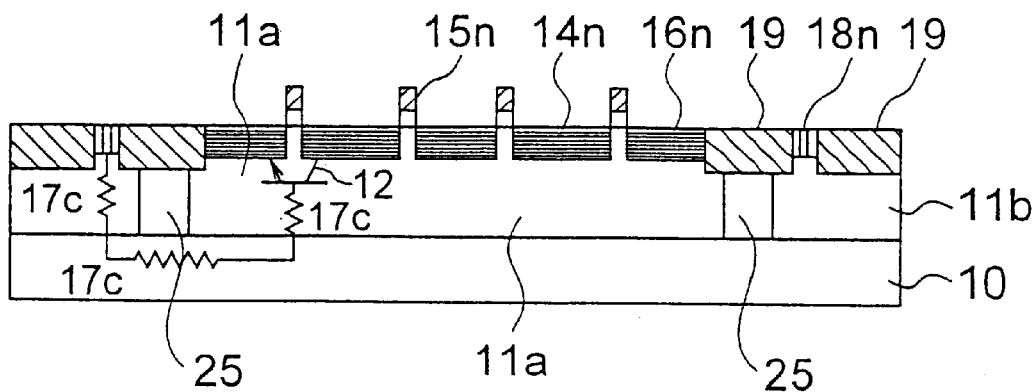
FIG. 6B is a sectional view taken along line A–A' in FIG. 6A.

Referring to FIGS. 6A and 6B, the semiconductor device according to the present embodiment differs is similar to the first embodiment except that an N-well 25 implementing a second conductivity type region is provided between the first well region 11a and the second well region 11b. Since the N-well 25 is of a conductivity type opposite that of the first and second well regions 11a and 11b, when a positive ESD surge current enters the first well region 11a, a charge carried by the surge current can move to the N-well 25 but cannot move from the N-well 25 to the second well region 11b. Therefore, the surge current flows to the guard ring 18n via the P-type substrate 10 and the second P-well 11b and then flows to the ground. Accordingly, the parasitic resistor 17c is formed by the first P-well 11a, the P-type substrate 10, and the second P-well 11b. Since the P-type lightly-doped substrate 10 is provided in the path along which the parasitic resistor 17c is formed, as in the case of first embodiment, a parasitic resistor 17c having the desired resistance can be formed within a smaller distance than that in the case where the parasitic resistor 17c is formed of only the P-well 11.

Conventionally, the distance between the guard ring 18n and the source region 16n of the first transistor 33 adjacent to the guard ring 18n was about 10 μm. By contrast, the same resistance as that of the conventional parasitic resistor can be obtained even when the distance is decreased to about 3 μm. Therefore, the size of the nMOSFET 31 can be decreased, resulting in that the chip size of the semiconductor device can be decreased. Further, since the N-well 25 disposed between the first P-well 11a and the second 11b can be formed in a common fabrication step for forming N-wells in the internal circuit, the N-well 25 can be formed through modification of a mask pattern, without addition of any specific fabrication process.

Fourth Embodiment

Figure 7A:
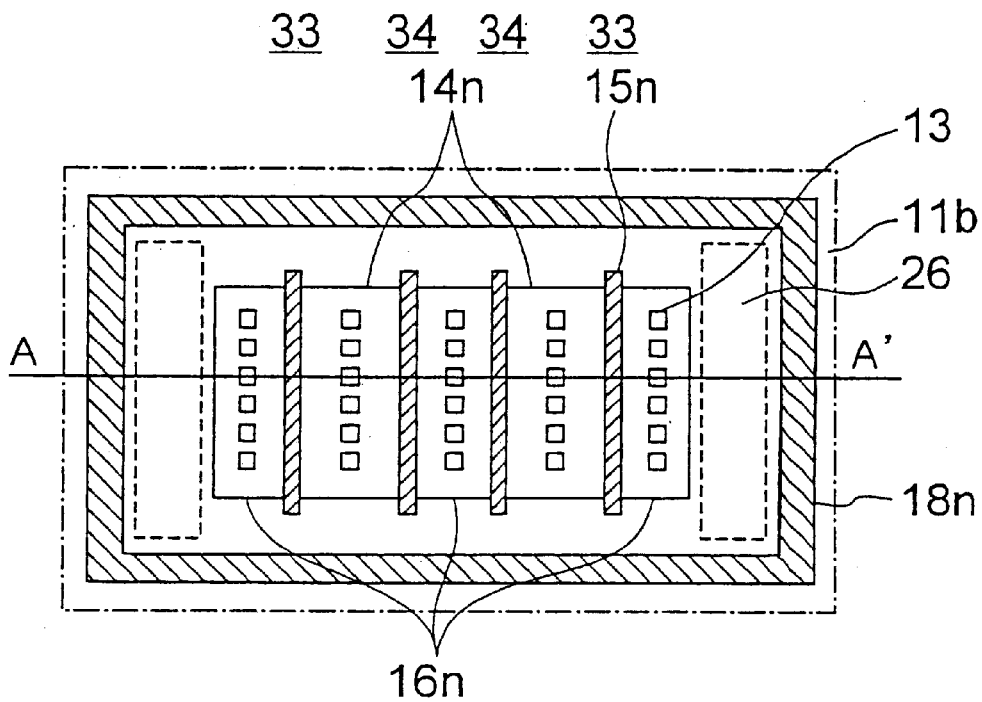
FIG. 7A is a plan view of a semiconductor device according to a fourth embodiment of the present invention.
Figure 7B:
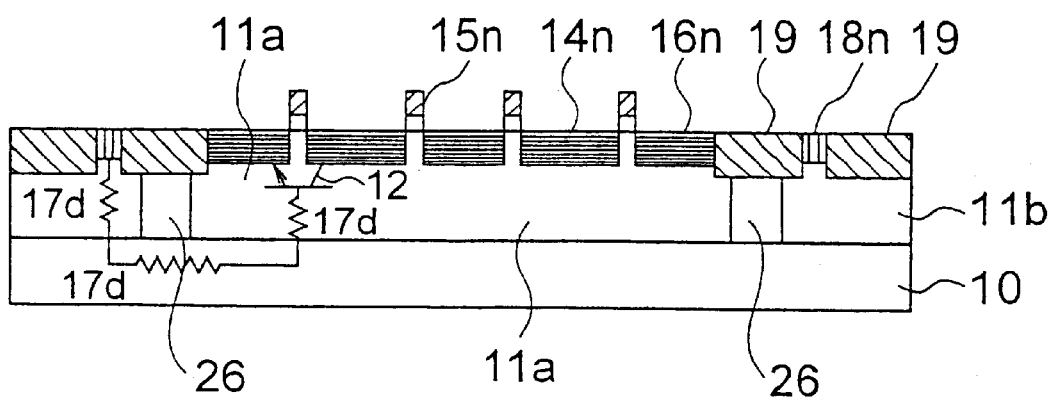
FIG. 7B is a sectional view taken along line A–A' in FIG. 7A.

Referring to FIGS. 7A and 7B, the semiconductor device according to the present embodiment is similar to the third embodiment except that an N-well 26 is formed as a second conductivity type region only between the guard ring 18n and the source 16n of each of the protective transistors disposed adjacent to the guard ring 18n. Specifically, the N-well 26 is formed between each of the first transistors 33 and the corresponding side of the guard ring 18n extending parallel to the longitudinal direction of the gates 15n and is not formed between each of the first and second transistors 33 and 34 and the corresponding side of the guard ring 18n extending perpendicular to the longitudinal direction of the gates 15n. As shown in FIG. 7B, each of the N-wells 26 between the first transistors 33 and the guard ring 18n underlies the field oxide film 19. In the present embodiment, a parasitic resistor 17d is formed by the first P-well 11a, the lightly-doped P-type substrate 10a, and the second P-well 11b along a path extending in the horizontal direction in FIG. 7A. The parasitic resistor 17d is also formed by the first P-well 11a only in the path extending along the vertical direction in FIG. 7A. As in the case of second embodiment, in both the horizontal and vertical directions, the distance between the guard ring 18n and the sources 16n is determined such that the parasitic resistor 17c has the desired resistance. Further, as in the case of third embodiment, the number of fabrication steps does not increase.

Fifth Embodiment

Figure 8A:
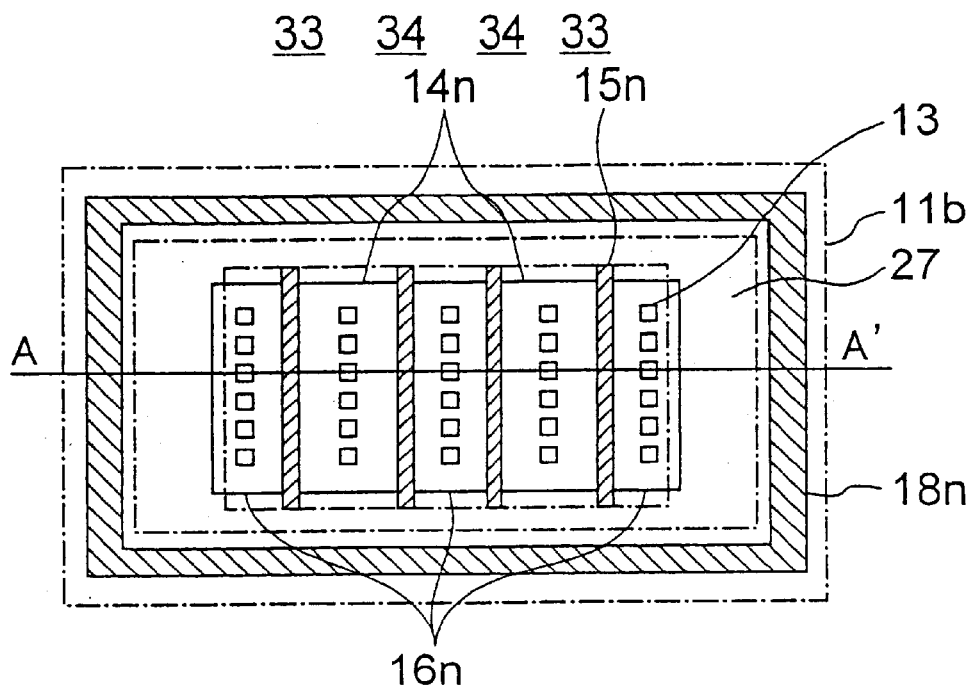
FIG. 8A is a top plan view of a semiconductor device according to a fifth embodiment of the present invention.
Figure 8B:
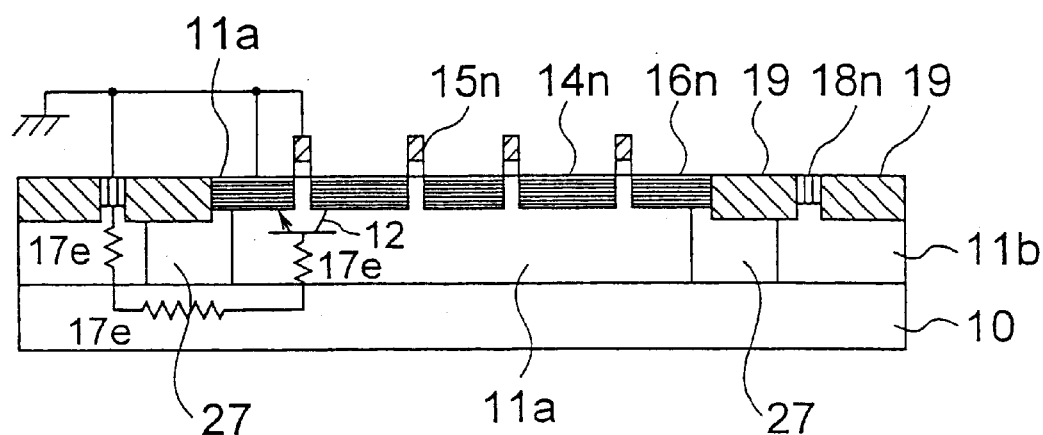
FIG. 8B is a sectional view taken along line A–A' in FIG. 8A.

Referring to FIGS. 8A and 8B, the semiconductor device according to the present embodiment is similar to the third embodiment except that an N-well 27 implemented by a second conductivity type region underlies the field oxide film 19 adjacent to the inner periphery of the guard ring 18n such that the inner edge of the N-well 27 protrudes into the source region 16n by 0.5 μm, and in that the source region 16n and the N-well 27 are connected to the ground. The minimum well width that can be fabricated in a diffusion process is determined based on the fabrication process for semiconductor devices. Therefore, when the wells are disposed as in the first through fourth embodiments, the distance between the guard ring and the source regions is restricted by the minimum well width. In the present embodiment, since the N-well region 27 protrudes below the source region 16n, the distance between the guard ring 18n and the source region 16n can be decreased.

Sixth Embodiment

Figure 9A:
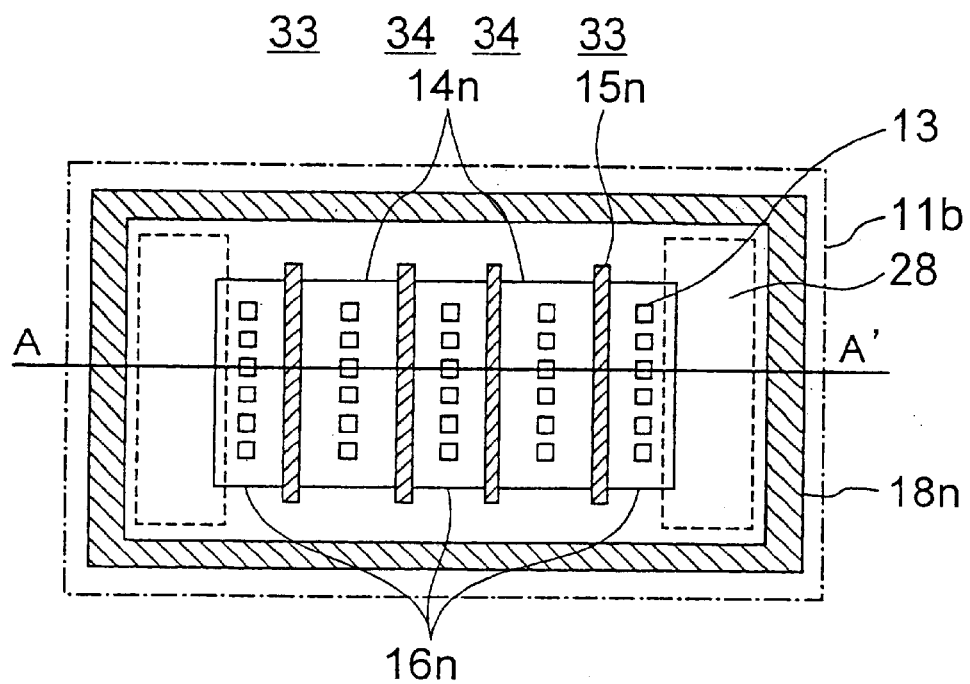
FIG. 9A is a top plan view of a semiconductor device according to a sixth embodiment of the present invention.
Figure 9B:
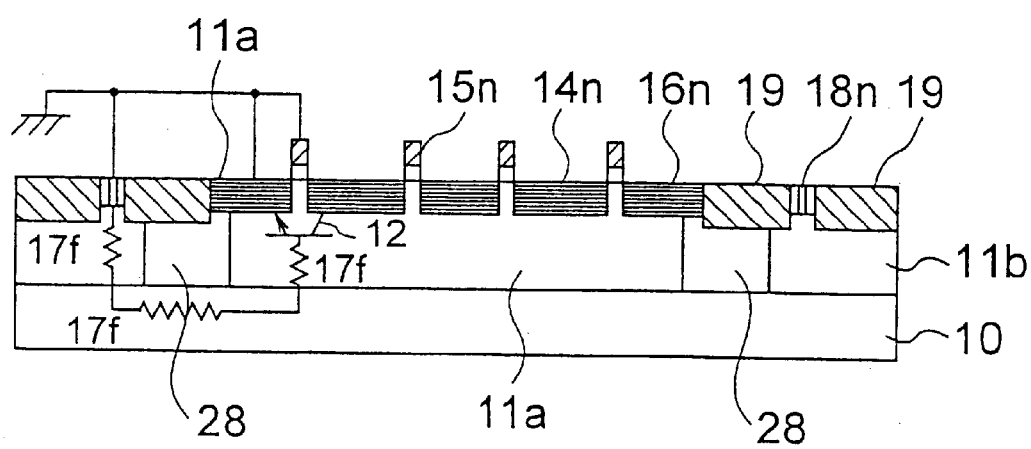
FIG. 9B is a sectional view taken along line A–A' in FIG. 9A.

Referring to FIGS. 9A and 9B, the semiconductor device according to the present embodiment is similar to the fifth embodiment except that an N-well 28 implemented by a second conductivity type region is formed only between the guard ring 18n and the source 16n of each first protective transistor 33 adjacent to the guard ring 18n.

Seventh Embodiment

Figure 10A:
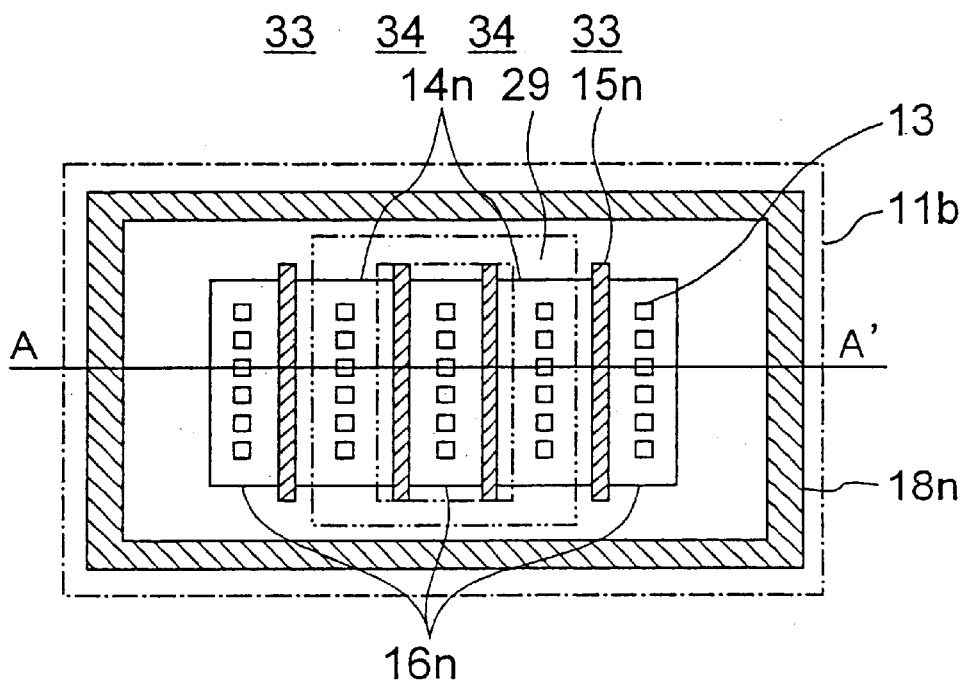
FIG. 10A is a top plan view of a semiconductor device according to a seventh embodiment of the present invention.
Figure 10B:
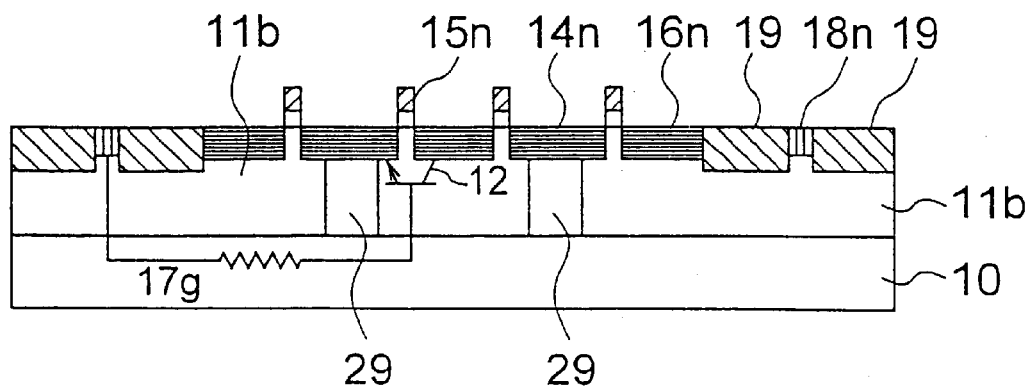
FIG. 10B is a sectional view taken along line A–A' in FIG. 10A.

Referring to FIGS. 10A and 10B, in the present embodiment, the gate 15n and the source 16n of each first protective transistor 33 disposed adjacent to the guard ring 18n are connected to the ground. Further, an N-well 29 implemented by a second conductivity type region and having a width of 4 μm is formed under the drain region 14n of the first protective transistor 33 disposed adjacent to the guard ring 18n. In the present embodiment, since the second protective transistors 34 surrounded by the N-well 29 enter a snap-back operation upon flow of a small breakdown current, the second protective transistors 34 surrounded by the N-well 29 enter the snap-back operation for protection prior to the protective transistors 33 disposed adjacent to the guard ring 18n. In this configuration, each of the second protective transistors 34 has a protective performance higher than that of the first protective transistors 33 adjacent to the guard ring 18n, a buffer having a high protection performance can be fabricated.

Eighth Embodiment

Figure 11A:
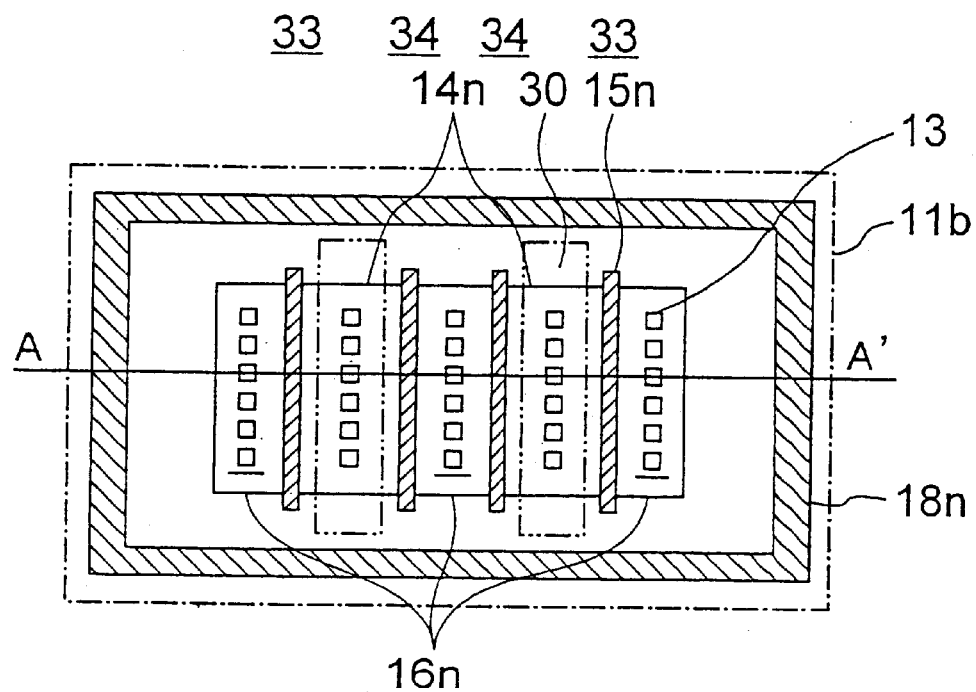
FIG. 11A is a top plan view of a semiconductor device according to an eighth embodiment of the present invention.
Figure 11B:
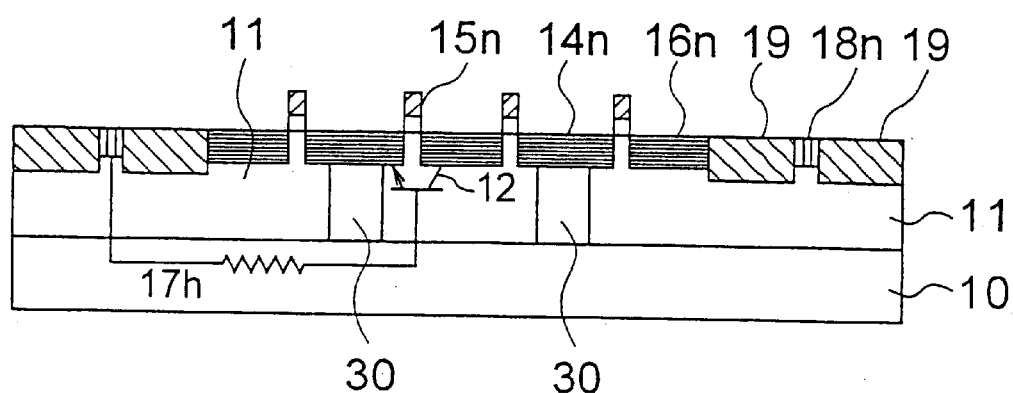
FIG. 11B is a sectional view taken along line A–A' in FIG. 11A.

Referring to FIGS. 11A and 11B, the semiconductor device according to the present embodiment is similar to the seventh embodiment except that an N-well 30 implemented by a second conductivity type region is formed only under the drain 14n of each first protective transistor adjacent to the guard ring 18n.

The present inventors noticed the fact that in order to initiate a snap-back operation of the first protective transistors disposed adjacent to the guard ring prior to the snap-back operation of the second transistors, the parasitic bipolar transistor requires a higher base potential than the conventional protective circuit. In this respect, in each of the first, third, fifth, seventh, and ninth embodiments, there has been described a technique for increasing the resistance of the parasitic resistor formed in the path of breakdown current of the first protective transistors 33 disposed adjacent to the guard ring, without increasing the distance between the guard ring and the protective transistors.

In each of the second, fourth, sixth, and eighth embodiments, a substrate region of a first or second conductivity type is provided on the right and left portions in the respective drawings. Therefore, there can be realized a semiconductor device in which a snap-back operation occurs quickly, and which has an enhanced resistance against latch-up and noise during operation. The guard ring provides an enhanced effect in prevention of latch-up, when the resistance between the drain region and the guard ring is low, thereby decreasing the substrate resistance of a current path between a current source and a point from which substrate current is withdrawn.

Ninth Embodiment

Figure 12A:
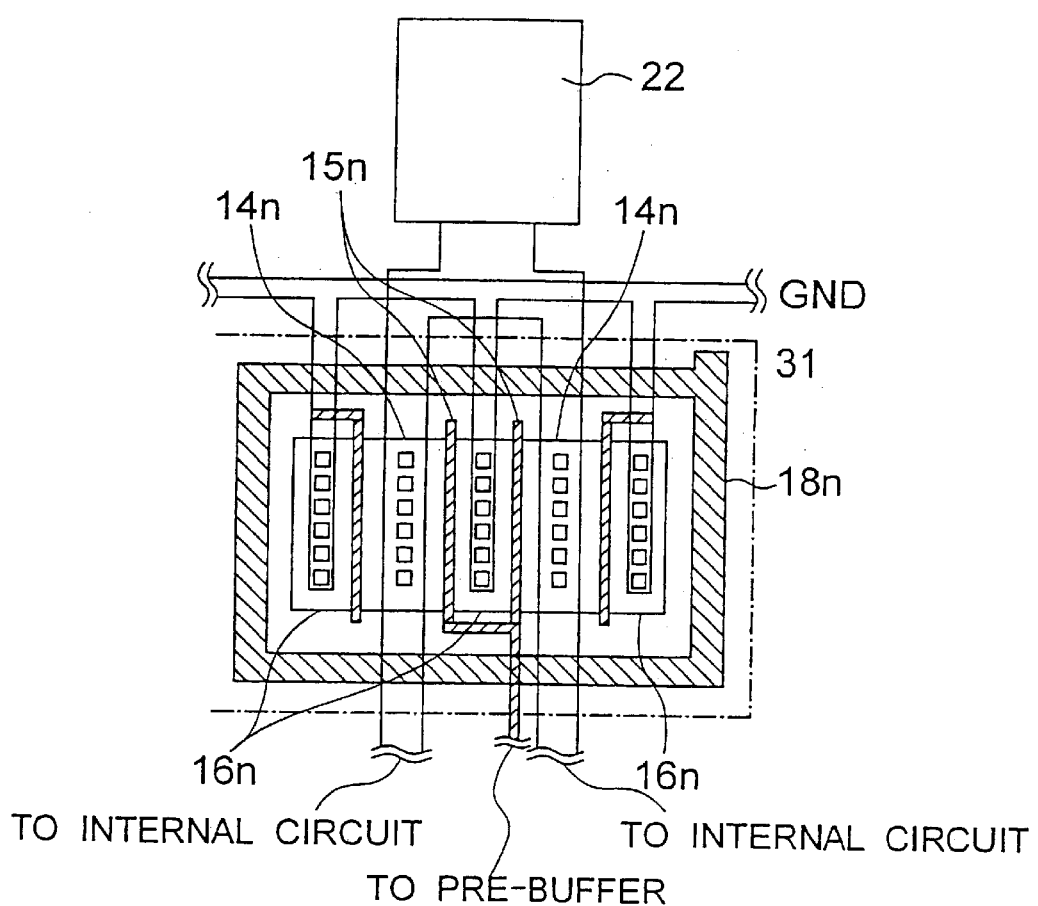
FIG. 12A is a top plan view of a semiconductor device according to a ninth embodiment of the present invention.

Referring to FIG. 12A, in the present embodiment, the sources 16n and the gates 15n of the first protective transistors 33 adjacent to the guard ring 18n are connected to the ground line GND, and the gates 15n of the second protective transistors 34 are connected to the output of an output pre-buffer. In the present embodiment, since the channel regions of the first protective transistors 33 adjacent to the guard ring 18n are fixed to a potential close to the ground potential, the parasitic resistor at that portion has an increased resistance. As a result, the protective transistors 33 easily enter a snap-back operation, even when the distance between the first protective transistors 33 and the guard ring 18n is small.

Figure 12B:
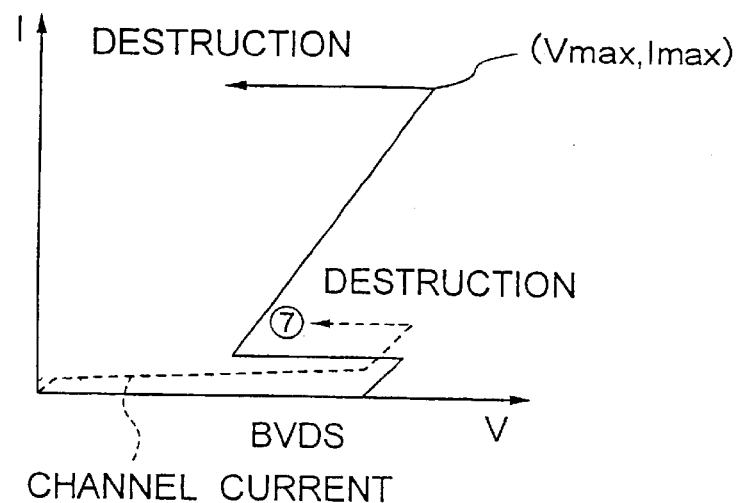
FIG. 12B is a graph showing the operation of the protective transistor in FIG. 12A.

The operation of the present embodiment will be described with reference to FIG. 12B. Especially, in a semiconductor device in which the gate of an output transistor is connected to a pre-buffer, when a surge current enters the device, the gate potential increases via a capacitive coupling, resulting in that a channel current flows from the drain to the source. As a result, concentration of current occurs, and when the parasitic resistance of the P-well is low, breakdown current and channel current both flow into the protective transistor before the protective transistor enters a snap-back operation, resulting in breakage of the protective transistor (at point ⑦ in FIG. 12B).

In the present embodiment, since the gates of the output transistors used as an output-stage pre-buffer are selectively grounded, the resistance of the selected output buffer transistors increases, with the result that the second protective transistors 34 require a higher voltage to enter a bipolar operation as compared with the first protective transistors 33. Consequently, the output buffer transistors 34 enter a snap-back operation less easily than do the first protective transistors 33, so that the first protective transistors 33 in the buffer region cause the snap-back operation. This structure allows the second protective transistors to reliably enter a snap-back operation for protection against a surge voltage caused by electrostatic charge. A semiconductor device according to the present embodiment was experimentally fabricated and the ESD withstand voltage was measured. The measurement demonstrated that the ESD withstand voltage was increased from a conventional level of 1000 V (MIL standard) to 4000 V, and that a sufficient effect is obtained.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:
   a semiconductor substrate having a substrate region of a first conductivity type or a second conductivity type opposite to said first conductivity type,
   a first well region of said first conductivity type formed on a surface region of said semiconductor substrate and having a first impurity concentration, said first well region receiving therein at least one MOS transistor,
   a guard ring of said first conductivity type disposed on a surface region of said semiconductor substrate and within a second well region,
   said at least one MOS transistor having source/drain regions of said second conductivity type and surrounded by said second well region, and
   a diffused region formed on the substrate region and disposed between said first well region having said at least one MOS transistor and said second well region having said guard ring therein, said diffused region being of said first conductivity type implemented by a portion of said substrate and having a second impurity concentration lower than said first concentration.

2. The semiconductor device as defined in claim 1, wherein said diffused region surrounds said source/drain regions of said MOS transistor.

3. The semiconductor device as defined in claim 2, wherein said at least one MOS transistor includes a plurality of protective transistors, and said diffused region is disposed only between said source region of one of said plurality of protective transistors and said guard ring.

4. The semiconductor device as defined in claim 1, wherein said diffused region underlies a field oxide film formed on said semiconductor substrate.

5. The semiconductor device as recited in claim 1 further comprising:
   a parasitic transistor formed between said source/drain regions of said at least one MOS transistor, said parasitic transistor protecting said at least one MOS transistor by turning on to enter a snap-back operation upon a surge voltage.

* * * * *